US011640905B2

(12) United States Patent
Aydin et al.

(10) Patent No.: US 11,640,905 B2
(45) Date of Patent: May 2, 2023

(54) PLASMA ENHANCED DEPOSITION OF SILICON-CONTAINING FILMS AT LOW TEMPERATURE

(71) Applicant: Applied Materials, Inc., Santa Clara, CA (US)

(72) Inventors: Aykut Aydin, Sunnyvale, CA (US); Rui Cheng, San Jose, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 80 days.

(21) Appl. No.: 17/125,349

(22) Filed: Dec. 17, 2020

(65) Prior Publication Data

US 2022/0199404 A1 Jun. 23, 2022

(51) Int. Cl.
*H01L 21/02* (2006.01)
*C23C 16/455* (2006.01)

(52) U.S. Cl.
CPC .. *H01L 21/02532* (2013.01); *C23C 16/45536* (2013.01); *H01L 21/02617* (2013.01)

(58) Field of Classification Search
None
See application file for complete search history.

(56) References Cited

U.S. PATENT DOCUMENTS

| 2004/0241342 | A1* | 12/2004 | Karim | H01L 21/02164 |
|---|---|---|---|---|
| | | | | 257/E21.279 |
| 2011/0256727 | A1 | 10/2011 | Beynet et al. | |
| 2016/0141172 | A1 | 5/2016 | Kang | |
| 2018/0286679 | A1 | 10/2018 | Houben et al. | |
| 2018/0308695 | A1 | 10/2018 | Lavoie et al. | |
| 2020/0251328 | A1 | 8/2020 | Zaitsu et al. | |

FOREIGN PATENT DOCUMENTS

| TW | 201946098 A | 12/2019 |
|---|---|---|
| WO | 2018-063804 A1 | 4/2018 |

OTHER PUBLICATIONS

International Search Report and Written Opinion dated Apr. 14, 2022 in International Patent Application No. PCT/US2021/062339, 8 pages.

* cited by examiner

*Primary Examiner* — Bo B Jang
(74) *Attorney, Agent, or Firm* — Kilpatrick Townsend & Stockton LLP

(57) ABSTRACT

Exemplary deposition methods may include flowing a silicon-containing precursor into a processing region of a semiconductor processing chamber. The method may include striking a plasma in the processing region between a faceplate and a pedestal of the semiconductor processing chamber. The pedestal may support a substrate including a patterned photoresist. The method may include maintaining a temperature of the substrate less than or about 200° C. The method may also include depositing a silicon-containing film along the patterned photoresist.

20 Claims, 3 Drawing Sheets

PLASMA ENHANCED DEPOSITION OF SILICON-CONTAINING FILMS AT LOW TEMPERATURE

TECHNICAL FIELD

The present technology relates to semiconductor processes and chamber components. More specifically, the present technology relates to modified components and deposition methods.

BACKGROUND

Integrated circuits are made possible by processes which produce intricately patterned material layers on substrate surfaces. Producing patterned material on a substrate requires controlled methods of formation and removal of exposed material. For example, in multiple patterning techniques, patterned photoresists may be deposited on a semiconductor substrate as part of a multi-step fabrication operation that may include transferring the pattern of the patterned photoresists into subsequent deposited layers. As such, the thermal stability of photoresist materials may limit the available processes for depositing patterned films, for example. In this way, intermediate pattern transfer processes between photoresist patterning and plasma deposition may be included to form a temperature stable patterned film. The intermediate processes may include substrate transfer or other operations that increase the complexity and time of fabrication, and may limit the efficiency and yield of semiconductor fabrication.

Thus, there is a need for improved systems and methods that can be used to produce high quality devices and structures. These and other needs are addressed by the present technology.

SUMMARY

Exemplary deposition methods may include flowing a silicon-containing precursor into a processing region of a semiconductor processing chamber. The method may include striking a plasma in the processing region between a faceplate and a pedestal of the semiconductor processing chamber. The pedestal may support a substrate including a patterned photoresist. The method may include maintaining a temperature of the substrate less than or about 200° C. The method may also include depositing a silicon-containing film along the patterned photoresist.

In some embodiments, the method may include maintaining the semiconductor processing chamber at a process pressure greater than or about 0.5 Torr. The patterned photoresist may define a trench. The patterned photoresist may define a top, a sidewall, and a bottom of a feature. The silicon-containing film may be characterized by a thickness overlying the top at least 40% of a thickness on the sidewall. The silicon-containing film may be characterized by the thickness on the sidewall at least 50% of a thickness on the bottom. The plasma may be struck by a power source operating at a pulsing frequency greater than or about 5 kHz and using a duty cycle less than 10%. A power of the plasma may be less than or about 300 W. A spacing between the faceplate and the pedestal may be greater than or about 400 mils. The method may further include flowing hydrogen with the silicon-containing precursor. The hydrogen may be introduced at a flowrate greater than or about 300 sccm.

Some embodiments of the present technology may encompass deposition methods. An exemplary method may include flowing a silicon-containing precursor into a processing region of a semiconductor processing chamber. The method may include striking a plasma in the processing region between a faceplate and a pedestal of the semiconductor processing chamber. The pedestal may support a substrate comprising a patterned photoresist. The method may include maintaining a temperature of the substrate less than or about 200° C. The method may also include depositing an amorphous silicon film along with the patterned photoresist.

Some embodiments of the present technology may encompass deposition methods. An exemplary method may include flowing a silicon-containing precursor into a processing region of a semiconductor processing chamber. The silicon-containing precursor may include oxygen. The method may include striking a plasma in the processing region, between a faceplate and a pedestal of the semiconductor processing chamber. The pedestal may support a substrate comprising a patterned photoresist. The method may include maintaining a temperature of the substrate less than or about 200° C. The method may also include depositing a silicon oxide film along with the patterned photoresist.

In some embodiments, flowing the silicon-containing precursor may include flowing nitric oxide and silane into the processing region at a volumetric flow ratio less than or about 2:1.

Such technology may provide numerous benefits over conventional systems and techniques. For example, the methods and systems may provide plasma-deposited silicon-containing films disposed on patterned photoresists, exhibiting improved coverage and with limited degradation of the photoresist material. In this way, the operations of embodiments of the present technology may produce improved CMOS fabrication processes, such as multiple patterning, which may facilitate the fabrication of smaller semiconductor features. In addition, the methods and systems may provide improved process integration, for example, by reducing the number of deposition and removal processes used to prepare patterned structures. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
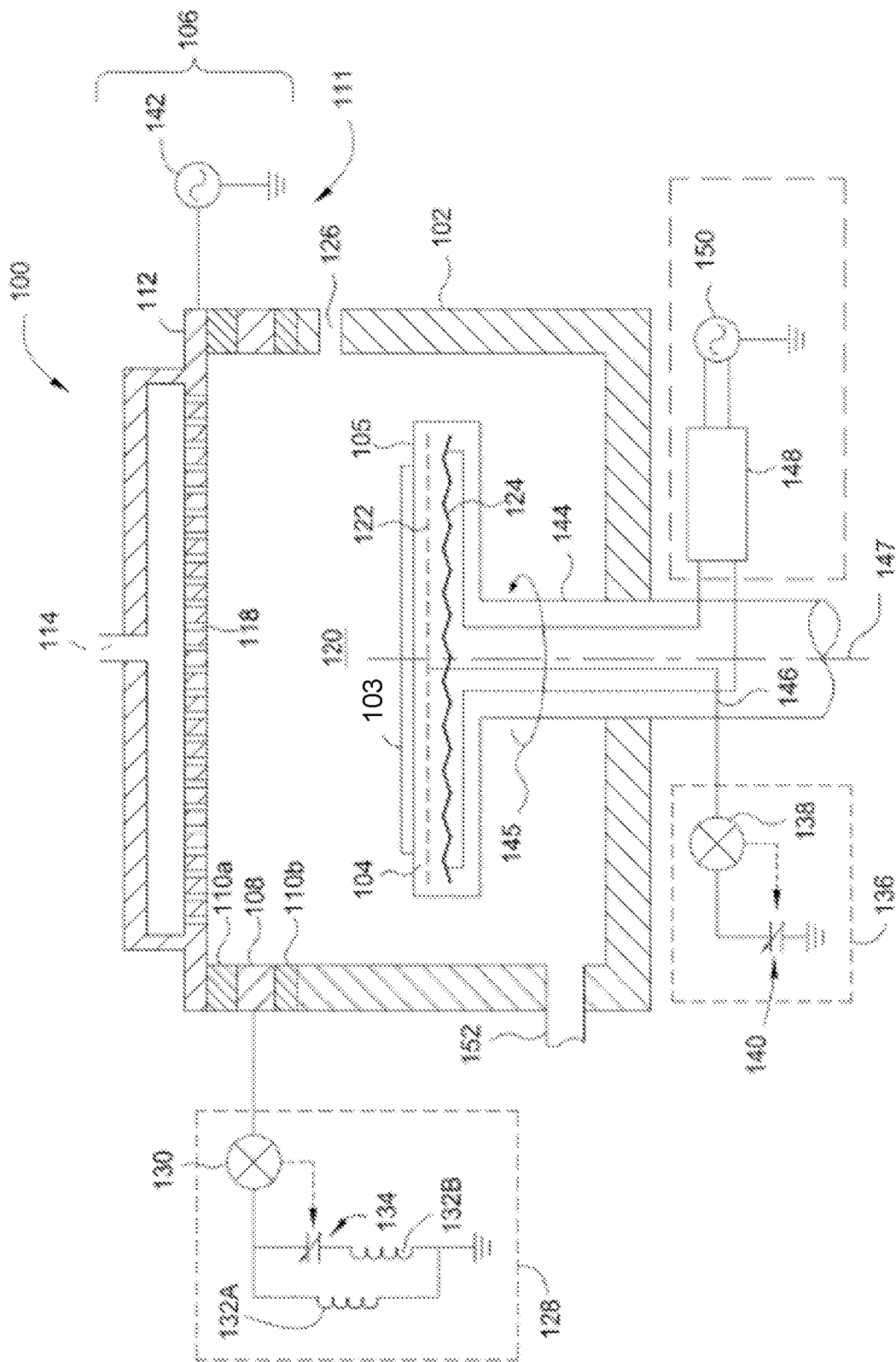
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During material deposition, such as of amorphous silicon or silicon oxide films, plasma enhanced deposition may produce a local plasma between a showerhead or gas distributor and a substrate support. The plasma conditions, which may be a function of parameters of the plasma power supply, such as plasma power, duty cycle, or pulse frequency, may cause heating of a substrate and the substrate support. Where a patterned photoresist has been disposed on the substrate, and where the patterned photoresist defines recessed features, such as trenches or gaps, the deposition process may heat the photoresist beyond a temperature at which the photoresist material starts to degrade. In such cases, material deposition under the plasma conditions may damage the patterned photoresist, limiting the effectiveness of deposition processes to fabricate patterned structures.

Conventional technology has approached this limitation through introducing intermediate processes to separate patterning a photoresist from plasma deposition. For example, in a self-aligned double patterning (SADP) process, deposition of amorphous silicon as spacer mask or liner may degrade a photoresist pattern if the amorphous silicon were to be deposited on the photoresist material directly. To that end, a photoresist pattern may be transferred onto another layer that exhibits higher thermal stability than the photoresist material. This intermediate process may introduce additional processes, including deposition, removal, or planarization. Furthermore, pattern-transfer processes may include conducting deposition of photoresist materials onto a semiconductor substrate in a first system, transferring the semiconductor substrate into a second deposition system to deposit an overlying film, and subsequently transferring the semiconductor substrate to a third system for plasma processing. The present technology may overcome these limitations by implementing improved deposition methods to deposit silicon-containing films within recessed features of a patterned photoresist directly. For example, controlling plasma conditions, processing parameters, and substrate temperature may permit deposition of silicon-containing films overlying patterned photoresist layers with reduced thermal degradation of the photoresist material. This may enable deposition on substrates defining recessed features of a characteristic dimension employed for multiple patterning processes, such as SADP, without intermediate transfer layers.

After describing general aspects of a chamber according to embodiments of the present technology in which plasma processing may be performed, specific methodology and component configurations may be discussed. It is to be understood that the present technology is not intended to be limited to the specific films and processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing region 120. A substrate 103 may be provided to the processing region 120 through an opening 126, which may be conventionally sealed for processing using a slit valve or door. The substrate 103 may be seated on a surface 105 of the substrate support 104 during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing region 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing region 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing region 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing region 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing region 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing region 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing region 120. The substrate may be subjected to an electrical bias using the third electrode 124 in some embodiments.

Upon energizing a plasma in the processing region 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chambers and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
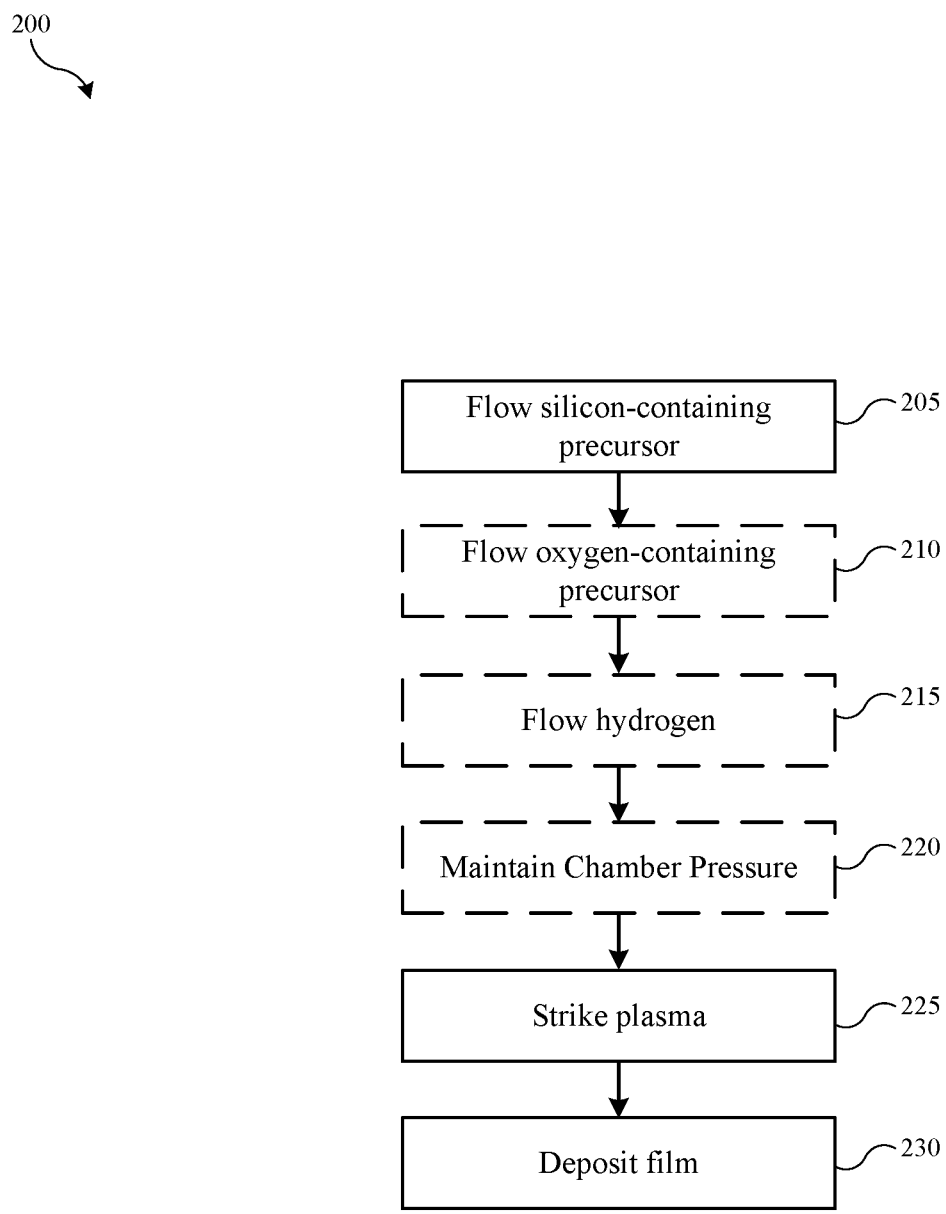
FIG. 2 shows exemplary operations in a deposition method according to some embodiments of the present technology.

FIG. 2 shows exemplary operations in a deposition method 200 according to some embodiments of the present technology. The method may be performed in a variety of processing chambers, including processing chamber 100 described above. Additional aspects of processing chamber 100 will be described further below. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing region 120 described above. Method 200 describes operations shown schematically in FIG. 3, the illustrations of which will be described in conjunction with the operations of method 200. It is to be understood that FIG. 3 illustrates only partial schematic views, and a processing system may include subsystems as illustrated in the figures, as well as alternative subsystems, of any size or configuration that may still benefit from aspects of the present technology.

Figure 3A:
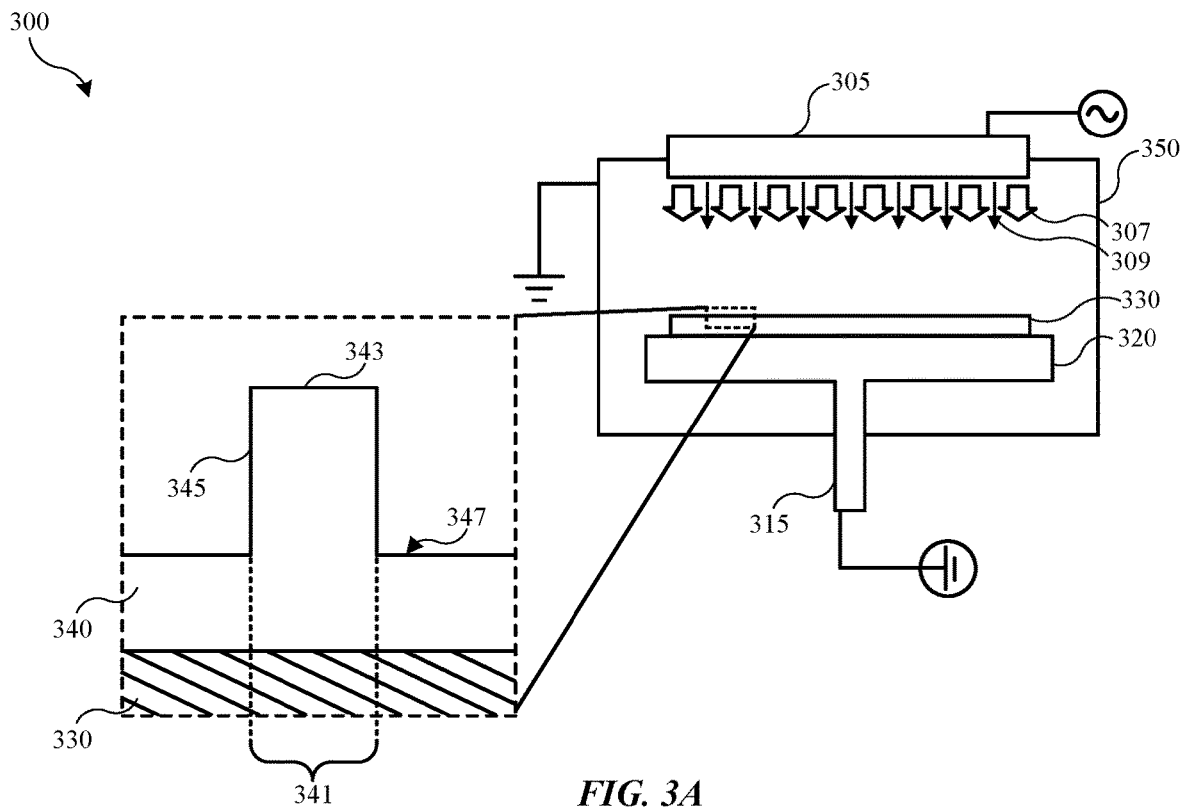
FIGS. 3A-3B show schematic views of an exemplary processing chamber during operations in a deposition method according to some embodiments of the present technology.
Figure 3B:
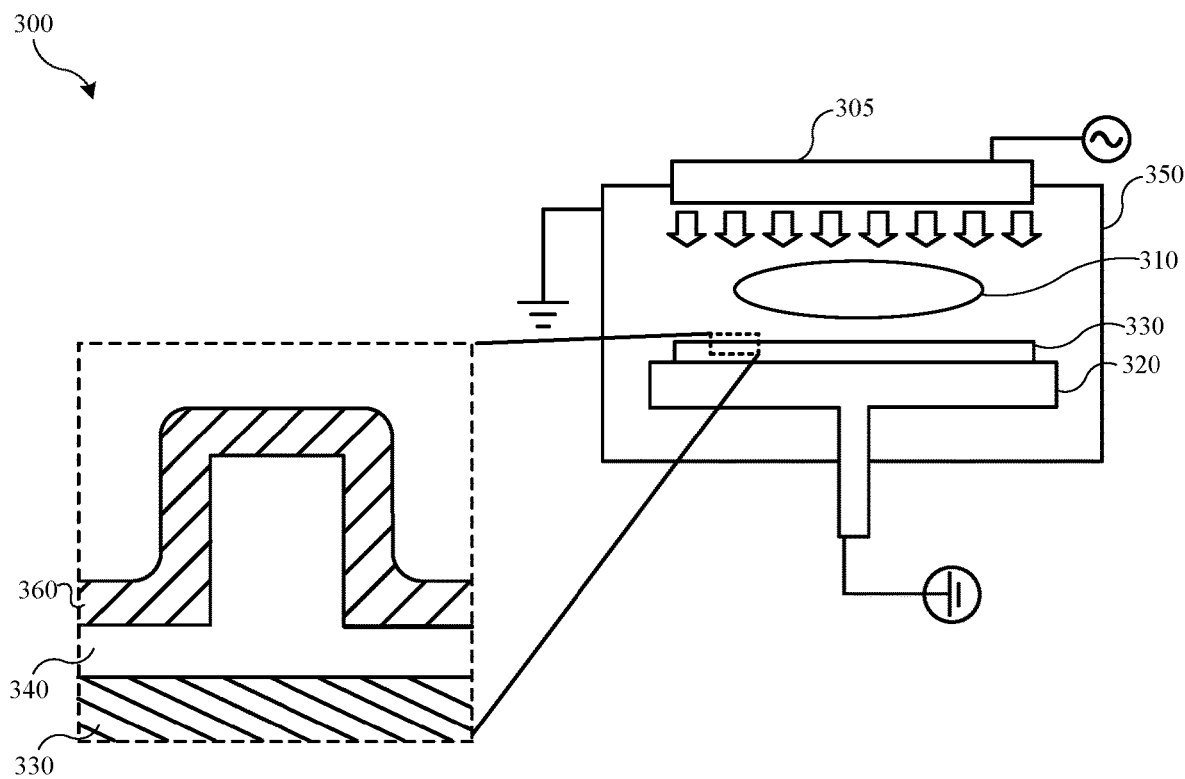

FIGS. 3A-3B show schematic views of an exemplary processing chamber during operations in a deposition method according to some embodiments of the present technology. FIGS. 3A-3B may illustrate further details relating to components in chamber 100, such as substrate support 104, gas distributor 112, and first source of electric power 142. System 300 is understood to include any feature or aspect of chamber 100 discussed previously in some embodiments. The system 300 may be used to perform semiconductor processing operations including deposition, removal, and cleaning operations. System 300 may show a partial view of the chamber components being discussed and that may be incorporated in a semiconductor processing system, and may illustrate a view across a center of the pedestal and gas distributor, which may otherwise be of any size. Any aspect of system 300 may also be incorporated with other processing chambers or systems as will be readily understood by the skilled artisan.

System 300 may include a semiconductor processing chamber 350 including a showerhead 305, through which precursors may be delivered for processing, and which may be configured to form a plasma 310 in the processing region. The showerhead 305 is shown at least partially internal to the chamber 350, and may be understood to be electrically isolated from the chamber 350, as described in reference to FIG. 1. In this way, the showerhead 305 may act as a live electrode or as a reference ground electrode of a direct plasma system to expose a substrate held on a pedestal or substrate support 315 to plasma generated species. The pedestal 315 may extend through the base of the chamber 350. The substrate support may include a support platen 320, which may hold a semiconductor substrate 330 during deposition or removal processes, as described in more detail in reference to FIG. 1 and FIG. 2. In addition to embedded electrodes described in connection with the chamber 100, the support platen 320 may also include a thermal control system that may facilitate processing operations including, but not limited to, deposition, etching, annealing, or desorption.

In some embodiments, the method 200 may include one or more operations preceding those illustrated in FIG. 2. For example, one or more deposition processes may be implemented to form a patterned photoresist 340 on the semiconductor substrate 330. The patterned photoresist 340 may be or include, but is not limited to, materials employed for lithographic processes in semiconductor fabrication. For example, SADP or other multiple-patterning processes may employ patterned photoresists as a technique to form patterned dielectric and gap-fill materials below a characteristic dimension at which other techniques are less effective. In this way, the semiconductor substrate 330 may be introduced into the chamber 350 already bearing the patterned photoresist 340. The patterned photoresist 340 may define one or more features 341, such as a recessed trench or gap, which may be characterized by dimensions including, but not limited to, a top 343, a sidewall 345, and a bottom 347. Where the top 343 and the sidewall 345 may be defined by a single photoresist feature 341, the bottom 347 may be defined as a surface between two proximal sidewalls 345, for example, where the patterned photoresist 340 includes multiple raised features 341 defining one or more trenches, as in SADP.

In some embodiments, the photoresist material may be selected from a group of materials suitable for deposition by pattern-transfer, such as photolithography, including, but not limited to, photopolymeric, photodecomposing, or photo-crosslinking photoresist materials. Polymeric photoresist materials may exhibit thermal sensitivity, for example, by degrading, melting, or sublimating above a threshold temperature. For example, the material from which the patterned photoresist 340 is formed may degrade at a temperature of greater than or about 50° C., greater than or about 100° C., greater than or about 150° C., greater than or about 200° C., greater than or about 250° C., greater than or about 300° C., greater than or about 350° C., greater than or about 400° C., greater than or about 450° C., greater than or about 500° C., or greater. In this way, the operations of the method 200, may be provided to facilitate deposition of a silicon-containing film 360 on the patterned photoresist 340, with negligible thermal degradation of the photoresist material or attendant loss of pattern integrity, by maintaining a process temperature during deposition about or below the characteristic threshold temperature of the photoresist material.

At operation 205, as illustrated in FIG. 3A, the method 200 may include introducing a precursor 307 into the processing region of the system 300. Introducing the precursor 307 may include flowing a carrier gas through the showerhead 305, which may include multiple channels, such as the apertures 118 of FIG. 1, sized and positioned such that the precursor 307 is introduced with a controlled distribution into the processing region. The precursor 307 may be or include a silicon-containing precursor including, but not limited to silane, tetra-ethyl orthosilicate (TEOS), or other silicon-containing precursor gas that is compatible with deposition of silicon-containing films, such as amorphous silicon, silicon oxide or silicon sub-oxide films as part of semiconductor fabrication. The precursor 307 may also include an inert carrier gas, including but not limited to, argon, helium, or nitrogen. The precursor 307 may be introduced into the system 300 via the showerhead 305 according to a uniform flow pattern across the surface of the support platen 320. In some embodiments, the precursor 307 may be introduced according to a non-uniform flow pattern, for example, using a curtain flow around a periphery of the support platen 320.

In some embodiments, the precursor 307 may be or include silane provided to the processing region at a flowrate greater than or about 0.1 SLM, greater than or about 0.2 SLM, greater than or about 0.3 SLM, greater than or about 0.4 SLM, greater than or about 0.5 SLM, greater than or about 1 SLM, greater than or about 1.5 SLM, greater than or about 2 SLM, greater than or about 2.5 SLM, greater than or about 3 SLM, greater than or about 3.5 SLM, greater than or about 4 SLM, greater than or about 4.5 SLM, greater than or about 5 SLM, greater than or about 5.5 SLM, greater than or about 6 SLM, greater than or about 6.5 SLM, greater than or about 7 SLM, greater than or about 7.5 SLM, greater than or about 8 SLM, greater than or about 8.5 SLM, greater than or about 9 SLM, greater than or about 9.5 SLM, greater than or about 10 SLM, or greater. A particular flowrate may be selected to provide deposition conditions, for example, as part of plasma enhanced deposition, which permit the deposition of a silicon-containing film below a threshold substrate temperature. For example, in addition to controlling plasma power parameters, the flowrate of silane may produce plasma conditions with a suitable ion concentration to limit surface ion bombardment and a suitable average electron temperature to limit surface heating. Similarly, the plasma temperature may be controlled at least in part through controlling the relative composition of the gas in the processing region.

In some embodiments, the precursor 307 may include an inert carrier gas. In plasma systems, inert carrier gases facilitate plasma ignition and control of plasma conditions. For example, providing the precursor 307 with a given inert gas fraction may permit the plasma to operate at particular deposition conditions, such as ionization fraction, ion temperature, or electron temperature. As such, the precursor 307 may be or include helium or argon, provided to the processing region at a flowrate greater than or about 0.1 SLM, greater than or about 0.2 SLM, greater than or about 0.3 SLM, greater than or about 0.4 SLM, greater than or about 0.5 SLM, greater than or about 1 SLM, greater than or about 1.5 SLM, greater than or about 2 SLM, greater than or about 2.5 SLM, greater than or about 3 SLM, greater than or about 3.5 SLM, greater than or about 4 SLM, greater than or about 4.5 SLM, greater than or about 5 SLM, greater than or about 5.5 SLM, greater than or about 6 SLM, greater than or about 6.5 SLM, greater than or about 7 SLM, greater than or about 7.5 SLM, greater than or about 8 SLM, greater than or about 8.5 SLM, greater than or about 9 SLM, greater than or about 9.5 SLM, greater than or about 10 SLM, greater than or about 10.5 SLM, greater than or about 11 SLM, greater than or about 11.5 SLM, greater than or about 12 SLM, greater than or about 12.5 SLM, greater than or about 13 SLM, greater than or about 13.5 SLM, greater than or about 14 SLM, greater than or about 14.5 SLM, greater than or about 15 SLM, or greater.

In some embodiments, method 200 may optionally include flowing an oxygen-containing precursor 309 into the processing region at operation 210, such that the precursor 307 includes oxygen. As illustrated in FIG. 3A, the oxygen-containing precursor 309 may be introduced through the showerhead 305 with the precursor 307. The oxygen-containing precursor may be or include, but is not limited to, diatomic oxygen, water vapor, or nitrous oxide. Introducing oxygen into the processing region as part of plasma enhanced deposition may permit the introduction of oxygen into deposited films, such as silicon oxide or silicon suboxide films. The specific oxygen-containing precursor 309 employed at operation 210 may be selected to provide a particular plasma deposition condition, such as a controlled oxygen ion concentration, due in part to plasma decomposition properties of the oxygen-containing precursor 309.

The oxygen-containing precursor 309 may be or include nitric oxide, and may be provided to the system 300 at a relative flowrate in proportion to the flowrate of the precursor 307. Providing a relative flowrate may permit the deposition conditions to be controlled, such that deposited films are characterized by a particular stoichiometry. For example, controlling oxygen concentration relative to silicon concentration in a deposition plasma may permit deposited films to include a sub-stoichiometric ratio of oxygen to silicon, which may, in turn, impart tailored dielectric properties to the deposited films. To that end, the oxygen-containing precursor 309 may be provided at optional operation 210 at a relative flowrate of less than or about 5:1, less than or about 4:1, less than or about 3:1, less than or about 2:1, less than or about 1:1, less than or about 1:2, less than or about 1:3, less than or about 1:3, less than or about 1:4, less than or about 1:5, or less, relative to the flowrate of the precursor 307. In nominal terms, the oxygen containing precursor 309 may be introduced to the processing region at a flowrate greater than or about 0.1 SLM, greater than or about 0.2 SLM, greater than or about 0.3 SLM, greater than or about 0.4 SLM, greater than or about 0.5 SLM, greater than or about 1 SLM, greater than or about 1.5 SLM, greater than or about 2 SLM, greater than or about 2.5 SLM, greater than or about 3 SLM, greater than or about 3.5 SLM, greater than or about 4 SLM, greater than or about 4.5 SLM, greater than or about 5 SLM, greater than or about 5.5 SLM, greater than or about 6 SLM, greater than or about 6.5 SLM, greater than or about 7 SLM, greater than or about 7.5 SLM, greater than or about 8 SLM, greater than or about 8.5 SLM, greater than or about 9 SLM, greater than or about 9.5 SLM, greater than or about 10 SLM, greater than or about 10.5 SLM, greater than or about 11 SLM, greater than or about 11.5 SLM, greater than or about 12 SLM, greater than or about 12.5 SLM, greater than or about 13 SLM, greater than or about 13.5 SLM, greater than or about 14 SLM, greater than or about 14.5 SLM, greater than or about 15 SLM, or greater.

Subsequent introducing the oxygen-containing precursor 309, method 200 may optionally include introducing hydrogen into the processing region along with the precursor 307 at operation 215. Hydrogen may permit the reaction conditions of the method 200 to be controlled, as an approach to tailoring the material structure and the chemical properties of deposited films. For example, in a plasma enhanced deposition process, the oxygen composition of deposited films may be controlled through control of the hydrogen concentration in the plasma. In some embodiments, the hydrogen may inhibit surface oxidation reactions and, as such may improve conformality of deposited material. In this way, the precursor 307 may also include hydrogen, for example, hydrogen gas, provided to the processing region at a flowrate greater than or about 0.01 SLM, greater than or about 0.1 SLM, greater than or about 0.2 SLM, greater than or about 0.3 SLM, greater than or about 0.4 SLM, greater than or about 0.5 SLM, greater than or about 1 SLM, greater than or about 1.5 SLM, greater than or about 2 SLM, greater than or about 2.5 SLM, greater than or about 3 SLM, greater than or about 3.5 SLM, greater than or about 4 SLM, or greater.

In some embodiments, the method 200 may optionally include maintaining, at operation 220, the semiconductor processing chamber at an operating pressure that promotes the formation of substantially conformal coatings at reduced deposition temperature. For example, the pressure may influence plasma density during plasma operation, may localize the plasma near electrode surfaces, and may also influence the surface adsorption of precursor on surfaces of the photoresist 340. In this way, maintaining an operating pressure greater than or about a threshold pressure may improve the conformality of deposited films, for example, by providing significant precursor concentration within recesses or trenches defined by the features 341 of the patterned photoresist 340, by reducing dissociation of precursor in the process volume, or by concentrating plasma energy in a region near the surface of the substrate 330. In some embodiments, the chamber pressure may be maintained greater than or about 0.1 Torr, greater than or about 0.5 Torr, greater than or about 1 Torr, greater than or about 2 Torr, greater than or about 5 Torr, greater than or about 10 Torr, greater than or about 15 Torr, greater than or about 20 Torr, greater than or about 25 Torr, greater than or about 30 Torr, greater than or about 35 Torr, greater than or about 40 Torr, greater than or about 45 Torr, greater than or about 50 Torr, or greater.

Subsequent introducing the precursor 307, the method 200 may include forming the plasma 310 at operation 225. The plasma 310 may be struck between the support platen 320 and the showerhead 305 in a direct plasma configuration. High frequency RF (HFRF) power may be provided to the showerhead 305 such that it acts as a live electrode in a pulsed plasma configuration, with the support platen acting as a reference electrode. Forming the plasma 310 as a pulsed plasma may provide multiple advantages over uniform plasma systems employed for semiconductor fabrication methods. For example, pulsed plasmas may provide improved uniformity with respect to plasma generated species distribution in the processing volume. Since deposition processes are employed on a wafer scale, improved uniformity across the semiconductor substrate 330 may provide improved device yield per wafer, as well as other wafer-scale quality parameters. In another example, forming a high-frequency pulsed plasma may provide improved control of substrate temperature during plasma operation, for example, through control of ion concentration or ion directionality.

As described in reference to FIG. 1, the plasma system may include one or more power supplies that permit the chamber 350 to maintain a pulsed RF glow discharge in the processing region. For example, the plasma 310 may be produced by a power supply providing a plasma power at a given pulse frequency and duty cycle. Each of these parameters may be configured to provide plasma conditions conducive to forming a silicon containing film 360 about or below a limit of thermal stability of the material of the patterned photoresist 340. For example, configuring the pulse frequency or the duty cycle of the plasma power supply may generate the plasma 310 such that it includes a controlled plasma composition, in terms of ion and electron densities as well as plasma generated species composition.

As an illustrative example, the duty cycle may influence recombination of ions in the plasma 310, such that a higher duty cycle may produce a higher ion density in the plasma 310. Elevated ion density, in turn may induce heating of the semiconductor substrate 330 through ion-bombardment. As described in reference to FIG. 1, the support platen 320 may emanate an electric field, for example through an electrostatic chuck voltage employed to hold the semiconductor substrate 330. The electrostatic chuck voltage may induce precipitation of ions into the surface of the semiconductor substrate 330, causing bombardment-induced heating of the substrate. To that end, controlling the ion density may provide one avenue to controlling the temperature of the semiconductor substrate 330 during plasma deposition.

As another illustrative example, the pulse frequency may influence In this way, the selection of pulse frequency, duty cycle, or plasma "off time," may be possible within an operational window where the plasma 310 is sustained with limited substrate heating and with controlled plasma dissociation and/or reaction before precursor is able to reach the bottom 347 of features 341, and as such, may be available for localized plasma enhanced deposition. The resulting reactions may be better distributed over the surface of the photoresist, and may develop into coatings with improved conformality. For example, at 10% duty cycle, corresponding to plasma power being provided for 10% of the deposition time, plasma-enhanced deposition of a substantially conformal coating may be facilitated with reduced thermal degradation of the patterned photoresist 340, instead of forming an overlying layer that bridges gaps across neighboring features 341.

In some embodiments, the plasma 310 may be formed as a pulsed RF plasma with power provided to the showerhead 305. Plasma power may be provided at a power of less than or about 500 W, less than or about 450 W, less than or about 400 W, less than or about 350 W, less than or about 300 W, less than or about 250 W, less than or about 200 W, less than or about 150 W, less than or about 100 W, or less. By maintaining a lower plasma power, a more conformal deposition may be performed, and substrate heating from the plasma may be reduced to ensure deposition may be performed at temperatures below those at which the photoresist may be affected.

A plasma power source may drive the plasma 310 with a pulse frequency greater than or about 0.5 kHz, greater than or about 1 kHz, greater than or about 1.5 kHz, greater than or about 2 kHz, greater than or about 2.5 kHz, greater than or about 3 kHz, greater than or about 3.5 kHz, greater than or about 4 kHz, greater than or about 4.5 kHz, greater than or about 5 kHz, greater than or about 5.5 kHz, greater than or about 6 kHz, greater than or about 6.5 kHz, greater than or about 7 kHz, greater than or about 7.5 kHz, greater than or about 8 kHz, greater than or about 8.5 kHz, greater than or about 9 kHz, greater than or about 9.5 kHz, greater than or about 10 kHz, or greater. Additionally or alternatively, the plasma power source may drive the plasma 310 with a duty cycle less than or about 80%, less than or about 70%, less than or about 60%, less than or about 50%, less than or about 40%, less than or about 30%, less than or about 20%, less than or about 10%, less than or about 9%, less than or about 8%, less than or about 7%, less than or about 6%, less than or about 5%, less than or about 4%, less than or about 3%, less than or about 2%, less than or about 1%, less than or about 0.5%, or less. By operating at increased plasma "off" times, such as with duty cycles of less than or about 50%, effective plasma power may be further reduced, which may further limit temperature effects induced by plasma species.

As illustrated in FIG. 3B, the showerhead 305 and the support platen 320 may be separated by a spacing that defines the processing region. The spacing, in turn, may affect the properties of the plasma 310. For example, the spacing may induce structuring of the plasma, defining spatially localized plasma-generated species densities. In turn, localized plasma species density and energy distributions may affect the rate of deposition, the chemical structure of the silicon-containing film 360, the rate of etching, sputter rate, or other plasma-mediated chemical reactions occurring on the surface of the semiconductor substrate 330 or the patterned photoresist 340. In this way, the position of the support platen 320 may permit the plasma composition at the surface of the substrate 330 to be adjusted for improved deposition and at reduced temperature. In an illustrative example, positioning the support platen 320 too close to the showerhead 305 may place the semiconductor substrate 330 in a negative glow region of the plasma 310, which may be characterized by relatively high ion densities and average plasma temperatures. It would be understood that in such a configuration the semiconductor substrate may be heated beyond the limit of thermal stability of the patterned photoresist 340, and, as such, the deposition process would produce an inferior result. In this way, the spacing between the support platen 320 and the showerhead 305 may be configured such that the plasma 310 exhibits plasma parameters conducive to deposition of silicon-containing films, while also limiting exposure to energetic plasma species that could induce localized heating or other damaging effects in the patterned photoresist 340.

In this way, operation 225 may include positioning the pedestal at a spacing of at least or about 50 mils, at least or about 100 mils, at least or about 150 mils, at least or about 200 mils, at least or about 250 mils, at least or about 300 mils, at least or about 350 mils, at least or about 400 mils, at least or about 450 mils, at least or about 500 mils, at least or about 600 mils, at least or about 700 mils, at least or about 800 mils, at least or about 900 mils, at least or about 1000 mils, at least or about 1100 mils, at least or about 1200 mils, at least or about 1300 mils, at least or about 1400 mils, at least or about 1500 mils, or larger.

Subsequent forming the plasma 310, method 200 may include depositing the silicon-containing film 360 on the semiconductor substrate 330 at operation 230. The silicon-containing film 360 may be or include decomposition products generated in the plasma 310, for example, by reaction of silicon and oxygen in the plasma 310 that is then deposited on the substrate 330 and the patterned photoresist 340. As such, the silicon-containing film 360 may be or include silicon oxide, silicon sub-oxide, or amorphous silicon. While silicon is described as an exemplary material used to form a plasma deposited film, the operations of the method 200 may similarly be performed to deposit other plasma-generated films onto the patterned photoresist 340 at a suitably low temperature to limit thermal degradation of the photoresist material. For example, carbon or boron containing films may be similarly formed with substantial conformality on thermally sensitive photoresist materials.

Where the deposition of operation 230 is conducted under suitable plasma conditions to preserve the material integrity of the patterned photoresist 340, the semiconductor substrate 330 may be maintained at a temperature about or below a threshold temperature of thermal stability of the photoresist material. In some embodiments, maintaining a lower substrate temperature may permit forming the patterned photoresist 340 from a larger variety of photoresist materials. Additionally, maintaining the substrate temperature below the threshold temperature for the patterned photoresist 340 may permit deposition of silicon-containing films directly. For example, some materials may exhibit a relatively lower threshold temperature of thermal stability. In this way, maintaining a lower substrate temperature during plasma enhanced deposition may provide improved material selection, pattern integrity, and process optimization.

In some embodiments, the semiconductor substrate 330 and the patterned photoresist 340 may be maintained at a temperature less than or about 400° C., less than or about 350° C., less than or about 300° C., less than or about 250° C., less than or about 200° C., less than or about 150° C., less than or about 140° C., less than or about 130° C., less than or about 120° C., less than or about 110° C., less than or about 100° C., less than or about 90° C., less than or about 80° C., less than or about 70° C., less than or about 60° C., less than or about 50° C., less than or about 40° C., less than or about 30° C., less than or about 20° C., less than or about 10° C., or less.

As described in reference to FIG. 3A, the patterned photoresist 340 may define one or more raised features 349. In this way, the silicon-containing film 360 may deposit on lateral and vertical surfaces of the patterned photoresist 340, such as the sidewalls 345, the top 343 and the bottom 347.

Over time, the silicon-containing film 360 may form a substantially uniform coating, characterized by a relative coverage comparing a thickness of the silicon-containing film 360 on the sidewalls 345 to a thickness of the silicon-containing film 360 on the top 343. Similarly, the silicon-containing film 360 may be characterized by a relative thickness on the sidewalls 345 to a relative thickness on the bottom 347. Advantageously, by maintaining the substrate temperature at a suitable temperature, a film with improved thickness ratios may be formed, with little to no loss in pattern definition of the features 341 in the patterned photoresist 340.

In some embodiments, the relative thickness of the silicon-containing film 360 may be characterized by a top-to-side thickness ratio of greater than or about 20%, greater than or about 30%, greater than or about 40%, greater than or about 50%, greater than or about 60%, greater than or about 70%, greater than or about 80%, greater than or about 90%, greater than or about 95%, or greater. In some embodiments, a side-to-bottom thickness ratio may fall within the same or a similar range. In this way, the deposition process of operation 230 may provide a substantially conformal silicon-containing film 360 that is formed onto the patterned photoresist 340 by plasma deposition processes, while maintaining the temperature of the photoresist material below a temperature at which the photoresist material is affected by thermal degradation.

As such, the method 200 and its constituent operations may provide one or more improvements to plasma enhanced deposition processes for depositing patterned layers onto semiconductor substrates. For example, as part of SADP processes, depositing amorphous silicon or silicon oxide directly onto patterned photoresist, rather than onto an intermediate transfer layer, may reduce the number of deposition, removal, and finishing processes that are included in the fabrication of a semiconductor device. In another example, deposition onto photoresist may improve pattern fidelity by reducing the number of transfer operations that may incur a resolution penalty. Furthermore, reducing the number of steps in a patterning process may reduce waste, improve efficiency, and improve yield of semiconductor fabrication operations, for example, by limiting a number of gas exchange, baking, planarizing, or cleaning operations.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A deposition method, comprising:
   flowing a silicon-containing precursor into a processing region of a semiconductor processing chamber;
   striking a plasma to the silicon-containing precursor in the processing region between a faceplate and a pedestal of the semiconductor processing chamber, the pedestal supporting a substrate comprising a patterned photoresist;
   maintaining a temperature of the substrate less than or about 200° C.; and
   depositing a silicon-containing film along the patterned photoresist.

2. The deposition method of claim 1, further comprising:
   maintaining the semiconductor processing chamber at a process pressure greater than or about 0.5 Torr.

3. The deposition method of claim 1, wherein the patterned photoresist defines a top, a sidewall, and a bottom of a feature, and wherein the silicon-containing film is characterized by a thickness overlying the top at least 40% of a thickness on the sidewall.

4. The deposition method of claim 3, wherein the silicon-containing film is characterized by the thickness on the sidewall at least 50% of a thickness on the bottom.

5. The deposition method of claim 1, wherein the plasma is struck by a pulsed power source operating at a pulsing frequency greater than or about 5 kHz, a duty cycle less than 10%, and a power less than or about 300 W.

6. The deposition method of claim 1, wherein a spacing between the faceplate and the pedestal is greater than or about 400 mils.

7. The deposition method of claim 1, further comprising:
   flowing hydrogen with the silicon-containing precursor, wherein the hydrogen is introduced at a flowrate greater than or about 300 sccm.

8. A deposition method, comprising:
   flowing a silicon-containing precursor into a processing region of a semiconductor processing chamber;
   striking a plasma in the processing region between a faceplate and a pedestal of the semiconductor processing chamber, the pedestal supporting a substrate comprising a patterned photoresist;
   maintaining a temperature of the substrate less than or about 200° C.; and
   depositing an amorphous silicon film along the patterned photoresist.

9. The deposition method of claim 8, wherein the temperature of the substrate is maintained at less than or about 100° C.

10. The deposition method of claim 8, wherein the patterned photoresist defines a top, a sidewall, and a bottom of a feature, and wherein the amorphous silicon film is characterized by a thickness overlying the top at least 40% of a thickness on the sidewall.

11. The deposition method of claim 10, wherein the amorphous silicon film is characterized by the thickness on the sidewall at least 50% of a thickness on the bottom.

12. The deposition method of claim 8, wherein the plasma is struck by a pulsed power source operating at a pulsing frequency greater than or about 5 kHz, a duty cycle less than 10%, and a power less than or about 300 W.

13. The deposition method of claim 8, wherein a spacing between the faceplate and the pedestal is greater than or about 400 mils.

14. The deposition method of claim 8, further comprising:
   flowing hydrogen with the silicon-containing precursor, wherein the hydrogen is introduced at a flowrate greater than or about 300 sccm.

15. A deposition method, comprising:
   flowing a silicon-containing precursor into a processing region of a semiconductor processing chamber, the silicon-containing precursor comprising oxygen;
   striking a plasma to the silicon-containing precursor in the processing region, between a faceplate and a pedestal of the semiconductor processing chamber, the pedestal supporting a substrate comprising a patterned photoresist;
   maintaining a temperature of the substrate less than or about 200° C.; and
   depositing a silicon oxide film along the patterned photoresist.

16. The deposition method of claim 15, wherein the temperature of the substrate is maintained at less than or about 100° C.

17. The deposition method of claim 15, wherein the plasma is struck by a pulsed power source operating at a pulsing frequency greater than or about 5 kHz, a duty cycle less than 10%, and a power less than or about 300 W.

18. The deposition method of claim 15, wherein a spacing between the faceplate and the pedestal is greater than or about 400 mils.

19. The deposition method of claim 15, wherein flowing the silicon-containing precursor comprises flowing nitric oxide and silane into the processing region at a volumetric flow ratio less than or about 2:1.

20. The deposition method of claim 15, further comprising:
   flowing hydrogen with the silicon-containing precursor, wherein the hydrogen is introduced at a flowrate greater than or about 300 sccm.

* * * * *